(12) United States Patent
Lee et al.

(10) Patent No.: US 11,302,767 B2
(45) Date of Patent: Apr. 12, 2022

(54) DISPLAY PANEL WITH SHIELDED SIGNAL LINES ROUTED AROUND AN OPENING AREA IN THE DISPLAY PANEL

(71) Applicant: SAMSUNG DISPLAY CO., LTD., Yongin-si (KR)

(72) Inventors: Minku Lee, Yongin-si (KR); Kyunghoon Kim, Yongin-si (KR); Mihae Kim, Yongin-si (KR); Changwon Jeong, Yongin-si (KR); Wonmi Hwang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 1 day.

(21) Appl. No.: 16/821,424

(22) Filed: Mar. 17, 2020

(65) Prior Publication Data

US 2021/0091160 A1 Mar. 25, 2021

(30) Foreign Application Priority Data

Sep. 25, 2019 (KR) .......................... 10-2019-0118372

(51) Int. Cl.
*H01L 27/32* (2006.01)
*H01L 51/52* (2006.01)
*H01L 51/00* (2006.01)

(52) U.S. Cl.
CPC ........ *H01L 27/3276* (2013.01); *H01L 27/323* (2013.01); *H01L 27/3262* (2013.01);
(Continued)

(58) Field of Classification Search
None
See application file for complete search history.

(56) References Cited

U.S. PATENT DOCUMENTS

| 5,723,908 A | 3/1998 | Fuchida et al. |
| 10,134,826 B2 | 11/2018 | Ka et al. |

(Continued)

FOREIGN PATENT DOCUMENTS

| CN | 108919581 | 11/2018 |
| KR | 10-2017-0117291 | 10/2017 |

OTHER PUBLICATIONS

Machine language translation of CN 108919581 A, cited in the IDS filed Mar. 17, 2020 (Year: 2018).*

Primary Examiner — Erik Kielin
(74) Attorney, Agent, or Firm — F. Chau & Associates, LLC

(57) ABSTRACT

A display panel includes: a substrate including an opening area, a non-display area at least partially surrounding the opening area, and a display area; a plurality of first lines, each of which includes a first bypass portion along the opening area; a plurality of second lines, each of which includes a second bypass portion along the opening area; and a shield layer overlapping at least one first bypass portion. Each of the first lines includes a first or second conductive line in the non-display area. Each of the first and second conductive lines includes the first bypass portion. The first and second conductive lines are alternately arranged and are disposed on different layers. Each of the second lines includes a third conductive line in the non-display area. Each of the third conductive lines includes the second bypass portion, and at least partially overlaps the first or second conductive line.

19 Claims, 15 Drawing Sheets

(52) U.S. Cl.
CPC ...... *H01L 27/3265* (2013.01); *H01L 27/3272* (2013.01); *H01L 51/0096* (2013.01); *H01L 51/5281* (2013.01)

(56) References Cited

U.S. PATENT DOCUMENTS

| | | | | |
|---|---|---|---|---|
| 2017/0294502 A1* | 10/2017 | Ka | ...................... | H01L 27/3276 |
| 2019/0393295 A1* | 12/2019 | Moy | ................... | H01L 27/3279 |
| 2020/0176538 A1* | 6/2020 | Um | ..................... | H01L 27/3272 |
| 2020/0176539 A1* | 6/2020 | Sung | ................... | H01L 27/3276 |
| 2020/0403057 A1* | 12/2020 | Kang | ................... | G09G 3/3225 |

* cited by examiner

DISPLAY PANEL WITH SHIELDED SIGNAL LINES ROUTED AROUND AN OPENING AREA IN THE DISPLAY PANEL

CROSS-REFERENCE TO RELATED APPLICATION

This application claims priority under 35 U.S.C. § 119 to Korean Patent Application No. 10-2019-0118372, filed on Sep. 25, 2019, in the Korean Intellectual Property Office, the disclosure of which is incorporated by reference herein in its entirety.

TECHNICAL FIELD

One or more exemplary embodiments of the present invention relate to a display panel and a display apparatus including the display panel, and more particularly, to a display panel having increased reliability and a reduced non-display area and a display apparatus including the display panel.

DISCUSSION OF THE RELATED ART

Recently, display apparatuses have been used for various purposes. In addition, as display apparatuses have become thinner and lighter, their range of use has increased.

Since display apparatuses are being used in various ways, various methods may be used to design display apparatuses with various configurations, and an increased number of functions may be combined or associated with display apparatuses.

SUMMARY

According to an exemplary embodiment of the present invention, a display panel includes: a substrate including an opening area, a non-display area at least partially surrounding the opening area, and a display area at least partially surrounding the non-display area; a plurality of first lines extending in a first direction, wherein each of the plurality of first lines includes a first bypass portion extending along an edge of the opening area; a plurality of second lines extending in a second direction intersecting with the first direction, wherein each of the plurality of second lines includes a second bypass portion extending along the edge of the opening area; and a shield layer arranged in the non-display area and overlapping at least one first bypass portion, wherein each of the plurality of first lines includes a first conductive line or a second conductive line located in the non-display area, wherein each of the first conductive line and the second conductive line includes the first bypass portion, wherein the first conductive line and the second conductive line are alternately arranged and are disposed on different layers, and wherein each of the plurality of second lines includes a third conductive line located in the non-display area, wherein each of the third conductive lines includes the second bypass portion, and wherein the third conductive lines at least partially overlap the first conductive line or the second conductive line.

In an exemplary embodiment of the present invention, the third conductive line is arranged on a different layer than that of the shield layer.

In an exemplary embodiment of the present invention, a direct current voltage is applied to the shield layer.

In an exemplary embodiment of the present invention, the shield layer does not overlap the opening area.

In an exemplary embodiment of the present invention, a width of the third conductive line is greater than a width of the first conductive line or the second conductive line.

In an exemplary embodiment of the present invention, a width of the shield layer is greater than a width of the first conductive line or the second conductive line.

In an exemplary embodiment of the present invention, the display panel further includes: a plurality of display elements arranged in the display area; and a thin film transistor arranged in the display area and connected to each of the plurality of display elements; a storage capacitor arranged in the display area and connected to each of the plurality of display elements, wherein the thin film transistor includes a semiconductor layer and a gate electrode separated from the semiconductor layer, and the storage capacitor includes a lower electrode and an upper electrode arranged over the lower electrode.

In an exemplary embodiment of the present invention, the display panel further includes a first electrode layer and a second electrode layer arranged over the first electrode layer, wherein the first electrode layer is arranged on the thin film transistor, wherein the first conductive line includes a same material as the gate electrode, and the second conductive line includes a same material as the second electrode layer.

In an exemplary embodiment of the present invention, the third conductive line includes a same material as the upper electrode or the first electrode layer.

In an exemplary embodiment of the present invention, the shield layer includes a same material as the upper electrode or the first electrode layer.

In an exemplary embodiment of the present invention, each of the plurality of first lines further includes a fourth conductive line located in the display area.

In an exemplary embodiment of the present invention, the fourth conductive line is connected to the first conductive line or the second conductive line through a contact hole.

In an exemplary embodiment of the present invention, the fourth conductive line includes a same material as the first electrode layer.

In an exemplary embodiment of the present invention, each of the plurality of second lines further includes a fifth conductive line located in the display area.

In an exemplary embodiment of the present invention, the fifth conductive line is connected to the third conductive line through a contact hole.

In an exemplary embodiment of the present invention, the fifth conductive line includes a same material as the gate electrode or the upper electrode.

According to an exemplary embodiment of the present invention, a display apparatus includes: a substrate including an opening area, a non-display area at least partially surrounding the opening area, and a display area at least partially surrounding the non-display area; a plurality of display elements arranged in the display area; a plurality of first lines extending in a first direction, wherein each of the plurality of first lines includes a first bypass portion extending along an edge of the opening area; a plurality of second lines extending in a second direction intersecting with the first direction, wherein each of the plurality of second lines includes a second bypass portion extending along the edge of the opening area; a shield layer arranged in the non-display area and overlapping at least one first bypass portion; and a component including an electronic element arranged to correspond to the opening area.

In an exemplary embodiment of the present invention, each of the plurality of first lines includes a first conductive line or a second conductive line located in the non-display area, wherein each of the first conductive line and the second conductive line includes the first bypass portion, wherein the first conductive line and the second conductive line are alternately arranged and are disposed on different layers.

In an exemplary embodiment of the present invention, each of the plurality of second lines includes a third conductive line located in the non-display area, wherein each of the third conductive lines includes the second bypass portion, and wherein the third conductive lines at least partially overlap the first conductive line or the second conductive line.

In an exemplary embodiment of the present invention, the third conductive line is arranged on a different layer than that of the shield layer.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION OF THE EMBODIMENTS

Figure 1:
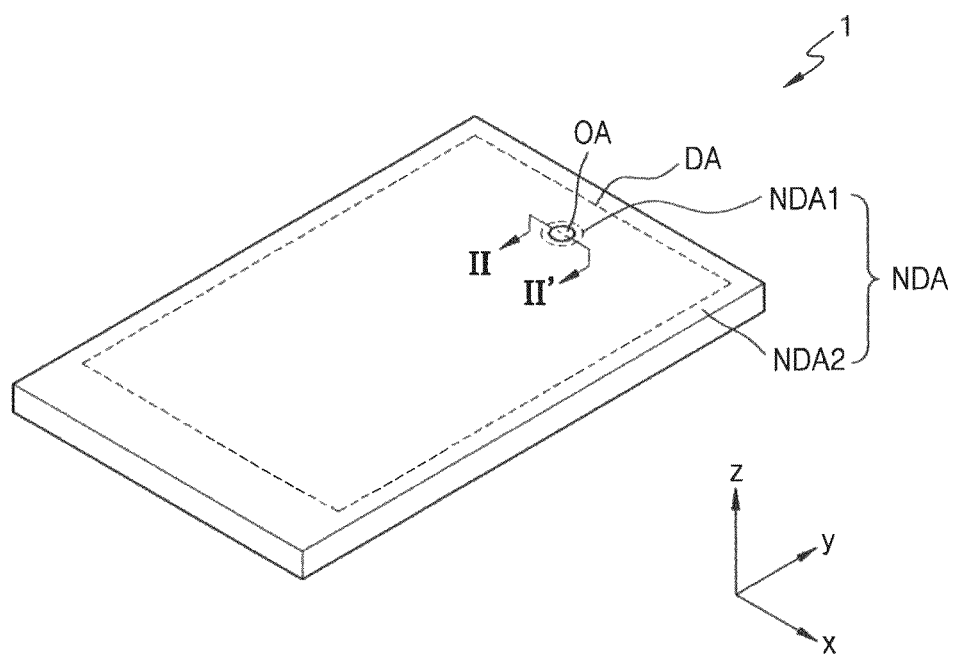
FIG. 1 is a perspective view schematically illustrating a display apparatus according to an exemplary embodiment of the present invention.

Exemplary embodiments of the present invention will now be described more fully with reference to the accompanying drawings. It is to be understood that the present invention may be embodied in different forms and thus should not be construed as being limited to the exemplary embodiments set forth herein. It is to be understood that like reference numerals may refer to like elements throughout the specification, and thus redundant descriptions may be omitted. As used herein, the term "and/or" includes any and all combinations of one or more of the associated listed items.

It will be understood that although terms such as "first" and "second" may be used herein to describe various components, these components should not be limited by these terms and these terms are only used to distinguish one component from another component. Thus, a first component discussed below could be termed a second component without departing from the spirit and scope of the present invention. In addition, as used herein, the singular forms "a," "an," and "the" are intended to include the plural forms as well, unless the context clearly indicates otherwise.

In addition, it will be understood that when a layer, region, or component is referred to as being "on" another layer, region, or component, the layer, region, or component may be "directly" on the other layer, region, or component or intervening layers, regions or components may be present therebetween.

Sizes of components in the drawings may be exaggerated clarity. In other words, because the sizes and thicknesses of components in the drawings may be exaggerated for clarity, the present invention is not limited thereto.

The x-axis, the y-axis, and the z-axis are not limited to three axes of the rectangular coordinate system and may be interpreted in a broader sense. For example, the x axis, the y axis, and the z axis may be perpendicular to each other, or may represent different directions that are not perpendicular to each other.

When an exemplary embodiment of the present invention may be implemented differently, a particular process order may be performed differently from a described order. For example, two consecutively described processes may be performed at substantially the same time or performed in an order opposite to the described order.

FIG. 1 is a perspective view schematically illustrating a display apparatus according to an exemplary embodiment of the present invention.

Referring to FIG. 1, a display apparatus 1 may include a display area DA that emits light and a non-display area NDA that does not emit light. The display apparatus 1 may provide an image by using light emitted from a plurality of pixels arranged in the display area DA.

The display apparatus 1 may include an opening area OA. The opening area OA may be at least partially surrounded by the display area DA, and as an exemplary embodiment of the present invention, FIG. 1 illustrates that the opening area OA is entirely surrounded by the display area DA. The non-display area NDA may include a first non-display area NDA1 surrounding the opening area OA and a second non-display area NDA2 surrounding the display area DA. For example, the first non-display area NDA1 may entirely surround the opening area OA, the display area DA may entirely surround the first non-display area NDA1, and the second non-display area NDA2 may entirely surround the display area DA. For example, the first non-display area NDA1 may be provided between the opening area OA and display area DA.

The opening area OA may be a position where an electronic element is arranged, as described below with reference to FIG. 2 or the like. The opening area OA may be a transmission area through which light and/or sound output from the electronic element is transmitted to the outside or through which light and/or sound propagating from the outside may be transmitted to the electronic element. In an exemplary embodiment of the present invention, when light is transmitted through the opening area OA, the light transmittance thereof may be about 50% or more, for example, about 70% or more, about 75% or more, about 80% or more, or about 85% or more, or about 90% or more.

Hereinafter, although an organic light emitting display apparatus is described as an example of the display apparatus 1 according to an exemplary embodiment of the present invention, the display apparatus of the present invention is not limited thereto. As an exemplary embodiment of the present invention, the display apparatus 1 of the present invention may be an inorganic light emitting display apparatus (e.g., inorganic light emitting display or inorganic electroluminescence (EL) display apparatus) or a display apparatus such as a quantum dot light emitting display apparatus. For example, an emission layer of a display element included in the display apparatus 1 may include an organic material, an inorganic material, quantum dots, an organic material and quantum dots, or an inorganic material and quantum dots.

Although FIG. 1 illustrates that the opening area OA is arranged at one side (e.g., the center upper end portion) of the display area DA that is tetragonal, the present invention is not limited thereto. For example, the shape of the display area DA may be circular, elliptical, or polygonal such as triangular or pentagonal, and the position of the opening area OA may be variously modified and positioned.

Figure 2:
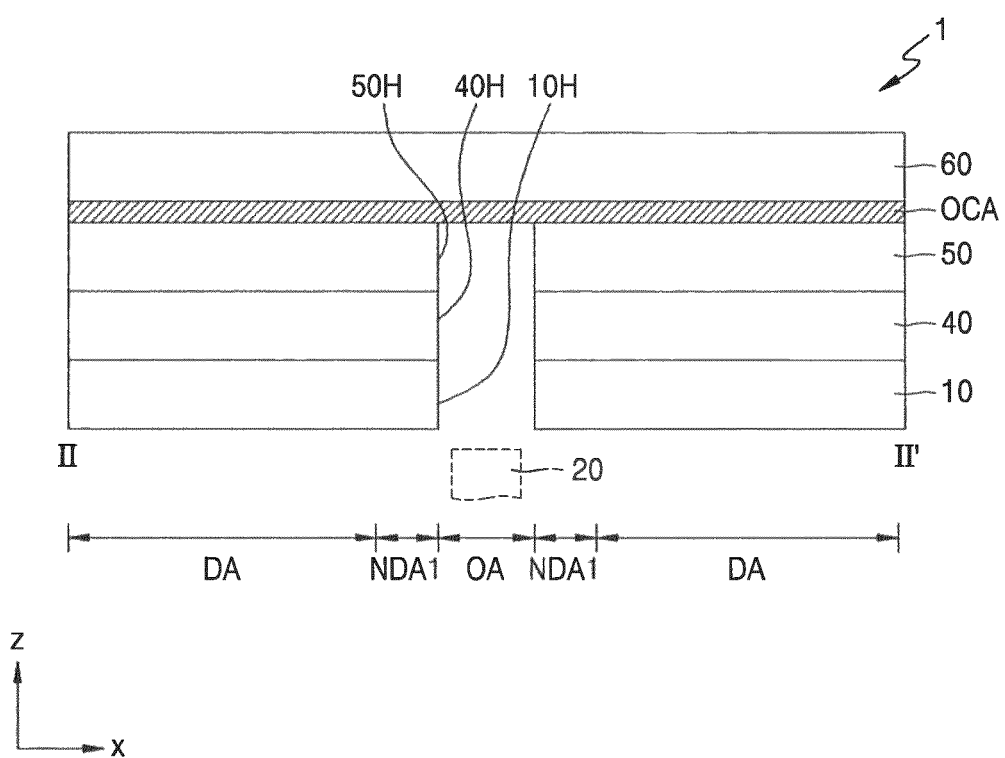
FIG. 2 is a cross-sectional view schematically illustrating a display apparatus according to an exemplary embodiment of the present invention.

FIG. 2 is a cross-sectional view schematically illustrating a display apparatus according to an exemplary embodiment of the present invention.

Referring to FIG. 2, a display apparatus 1 may include a display panel 10, an input sensing layer 40 and an optical functional layer 50 arranged over the display panel 10. The display apparatus 1 may further include a window 60 covering the optical function layer 50. The window 60 may be coupled to a component thereunder, for example, an optical functional layer 50, through an adhesive layer such as an optical clear adhesive OCA. The display apparatus 1 may be provided in various electronic apparatuses such as mobile phones, tablet personal computers (PCs), notebook computers, and smart watches.

The display panel 10 may include a plurality of diodes arranged in the display area DA. The input sensing layer 40 may be configured to acquire coordinate information according to an external input, for example, a touch event. The input sensing layer 40 may include a sensing electrode and trace lines connected to the sensing electrode. The input sensing layer 40 may be arranged on the display panel 10. The input sensing layer 40 may be configured to sense an external input by a mutual capacitance method or a self-capacitance method.

The input sensing layer 40 may be arranged on the display panel 10. For example, the input sensing layer 40 may be disposed directly on the display panel 10. In addition, the input sensing layer 40 may be coupled to the display panel 10 through an adhesive layer such as an optical clear adhesive. In an exemplary embodiment of the present invention, as illustrated in FIG. 2, the input sensing layer 40 may be arranged on the display panel 10, and in this case, no adhesive layer may be between the input sensing layer 40 and the display panel 10.

The optical functional layer 50 may include an anti-reflection layer. The anti-reflection layer may be configured to reduce the reflectance of light (e.g., external light) incident from the outside through the window 60 toward the display panel 10. The anti-reflection layer may include a functional layer such as a phase retarder and a polarizer. The phase retarder may be a film type or a liquid crystal coating type and may include a λ/2 phase retarder and/or a λ/4 phase retarder. In addition, the polarizer may be a film type or a liquid crystal coating type. The film type may include a stretched synthetic resin film, and the liquid crystal coating type may include liquid crystals arranged in a predetermined arrangement. The phase retarder and the polarizer may further include a protective film.

In an exemplary embodiment of the present invention, the anti-reflection layer may include a structure including color filters and a black matrix. The color filters may be arranged based on the color of light emitted from each of the subpixels of the display panel 10. The anti-reflection layer may include a destructive interference structure. The destructive interference structure may include a first reflective layer and a second reflective layer arranged on different layers. The first reflected light and the second reflected light respectively reflected by the first reflective layer and the second reflective layer may destructively interfere with each other, and accordingly, the extremal light reflectance may be reduced.

The optical functional layer 50 may include a lens layer. The lens layer may be configured to increase the light emission efficiency of light emitted from the display panel 10 or may be configured to reduce a color deviation. The lens layer may include a layer having a concave or convex lens shape and/or may include a plurality of layers having different refractive indexes. The optical functional layer 50 may include both the anti-reflection layer and the lens layer described above or may include any one of them.

The display panel 10, the input sensing layer 40, and/or the optical functional layer 50 may include an opening corresponding to the opening area OA. In this regard, FIG. 2 illustrates a structure in which the display panel 10, the input sensing layer 40, and the optical functional layer 50 respectively include first to third openings 10H, 40H, and 50H, and the first to third openings 10H, 40H, and 50H overlap each other.

In an exemplary embodiment of the present invention, at least one of the display panel 10, the input sensing layer 40, or the optical functional layer 50 may not include an opening. For example, any one or two components of the display panel 10, the input sensing layer 40, and/or the optical functional layer 50 may not include an opening. In addition, the display panel 10, the input sensing layer 40, and the optical functional layer 50 may not include an opening.

When an adhesive layer between the window 60 and the optical functional layer 50 includes an optical clear adhesive, the adhesive layer may not include a hole corresponding to the opening area OA.

A component 20 may be arranged in the opening area OA. The component 20 may include an electronic element. For example, the component 20 may include an electronic element using light and/or sound. For example, the electronic element may include a sensor such as an infrared sensor for receiving and using light, a camera for receiving light to capture an image, and a sensor for outputting and detecting light or sound to measure a distance or recognize a fingerprint or the like. As an additional example, the electronic element may include a miniature lamp for outputting light, or a speaker for outputting sound. In the case of an electronic element using light, it may use light of various wavelength bands such as visible light, infrared light, and ultraviolet light. In an exemplary embodiment of the present invention, the opening area OA may be a transmission area through which light output from the component 20 is transmitted to the outside or through which light propagating from the outside may be transmitted to the component 20.

In an exemplary embodiment of the present invention, when the display apparatus 1 is used as a smart watch or a vehicle instrument panel, the component 20 may be a member such as a clock hand or a needle indicating certain information (e.g., vehicle speed). When the display apparatus 1 includes a clock hand or a needle, the component 20 may be exposed to the outside through the window 60, and the window 60 may include an opening corresponding to the opening area OA.

The component 20 may include one or more components capable of adding additional functions to the display apparatus 1 as described above or may include components, such as accessories, capable of increasing the aesthetics and appeal of the display panel 10.

Figure 3:
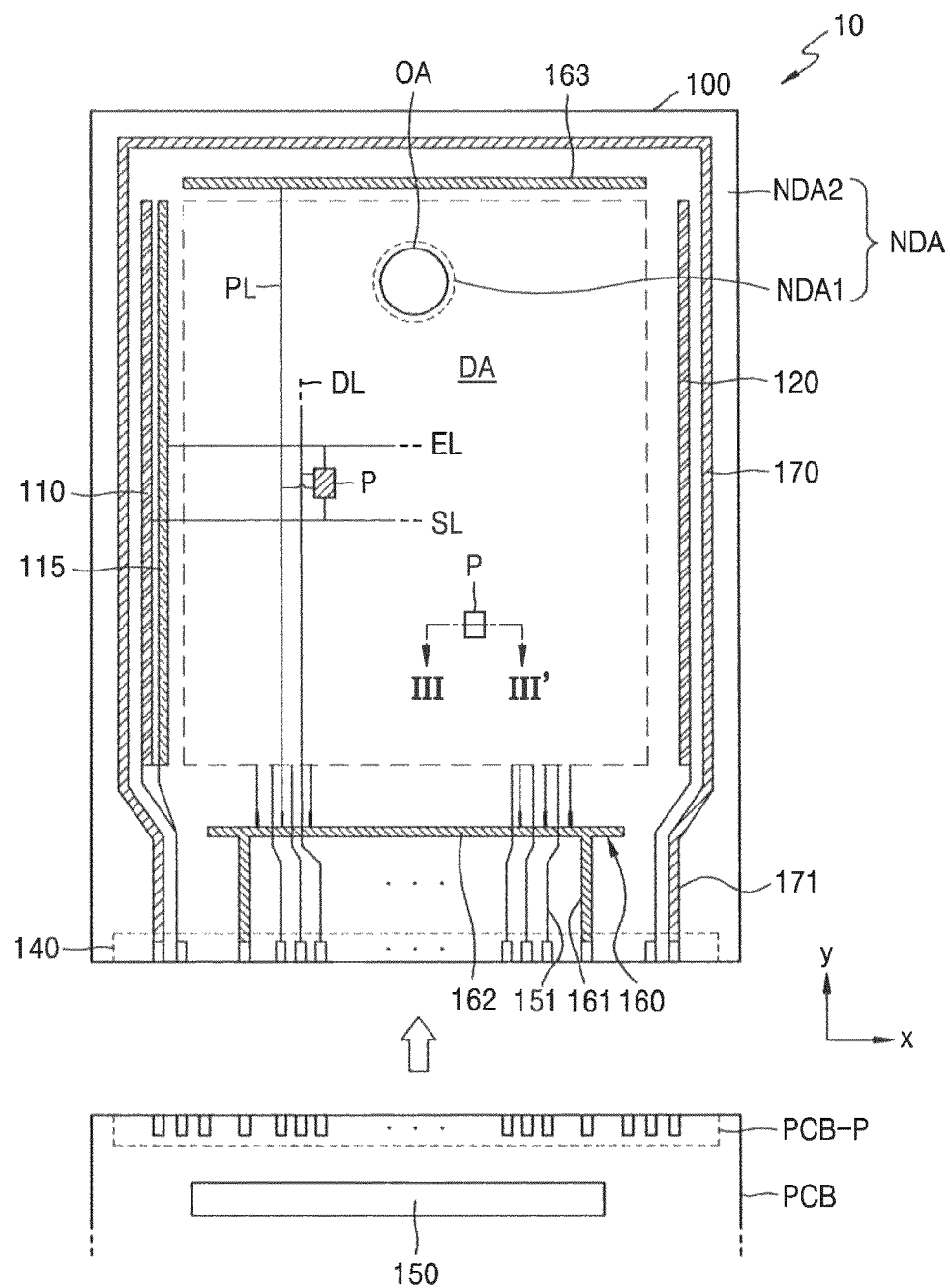
FIG. 3 is a plan view schematically illustrating a display panel according to an exemplary embodiment of the present invention.

FIG. 3 is a plan view schematically illustrating a display panel according to an exemplary embodiment of the present invention.

Referring to FIG. 3, the display panel 10 may include a plurality of pixels P arranged in the display area DA. Each of the pixels P may include a display element such as an organic light emitting diode. Each pixel P may emit, for example, red, green, blue, or white light through the organic light emitting diode. As described above, the pixel P may be understood as a pixel emitting light of any one color of red, green, blue, or white.

The opening area OA may be arranged inside the display area DA, and a plurality of pixels P may be arranged around the opening area OA. The plurality of pixels P may be arranged to surround the opening area OA, and the first non-display area NDA1, in which the pixels P are not arranged, may be arranged between the opening area OA and the display area DA. In the first non-display area NDA1, lines for applying a signal or power to the pixels P, which are spaced apart from each other, may bypass the opening area OA, the corresponding structure of which will be described below with reference to FIG. 5 or the like.

Each pixel P may be electrically connected to the outer circuits arranged in a non-display area NDA, for example, the second non-display area NDA2. A first scan driving circuit 110, a first emission driving circuit 115, a second scan driving circuit 120, a terminal 140, a data driving circuit 150, a first power supply line 160, and a second power supply line 170 may be arranged in the second non-display area NDA2.

The first scan driving circuit 110 may provide a scan signal to each pixel P through a scan line SL. The first emission driving circuit 115 may provide an emission control signal to each pixel P through an emission control line EL. The second scan driving circuit 120 may be arranged in parallel to the first scan driving circuit 110 with the display area DA therebetween. Some of the pixels P arranged in the display area DA may be electrically connected to the first scan driving circuit 110, and the other pixels P arranged in the display area DA may be connected to the second scan driving circuit 120. In an exemplary embodiment of the present invention, a second emission driving circuit may be arranged in parallel to the first emission driving circuit 115 with the display area DA therebetween.

The first emission driving circuit 115 may be arranged over the non-display area NDA while being spaced apart from the first scan driving circuit 110 in the x direction. In an exemplary embodiment of the present invention, the first emission driving circuit 115 may be arranged in the y direction with the first scan driving circuit 110.

The terminal 140 may be arranged at one side of a substrate 100. The terminal 140 may be exposed, without being covered by an insulating layer, to be electrically connected to a printed circuit board PCB. A terminal PCB-P of the printed circuit board PCB may be electrically connected to the terminal 140 of the display panel 10. The printed circuit board PCB may be configured to transmit power or signals of a controller to the display panel 10. A control signal generated by the controller may be transmitted to each of the first and second scan driving circuits 110 and 120 through the printed circuit board PCB. The controller may provide a first power and a second power ELVDD and ELVSS to the first and second power supply lines 160 and 170 through first and second connection lines 161 and 171, respectively. The first power ELVDD may be provided to each pixel P through a driving voltage line PL connected to the first power supply line 160, and the second power ELVSS may be provided to an opposite electrode of the pixel P connected to the second power supply line 170.

The data driving circuit 150 may be electrically connected to a data line DL. A data signal output from the data driving circuit 150 may be provided to each pixel P through a connection line 151 connected to the terminal 140 and a data line DL connected to the connection line 151. FIG. 3 illustrates that the data driving circuit 150 is arranged on a printed circuit board PCB; however, in an exemplary embodiment of the present invention, the data driving circuit 150 may be arranged on the substrate 100. For example, the data driving circuit 150 may be arranged between the terminal 140 and the first power supply line 160.

The first power supply line 160 may include a first subline 162 and a second subline 163 extending in a second direction (e.g., the x direction). The display area DA may be between the first subline 162 and the second subline 163, and the first subline 162 and second subline 163 may extend parallel to one another. The second power supply line 170 may partially surround the display area DA. For example, the second power supply line 170 may extend around all sides of the display area DA except for one side.

Figure 4:
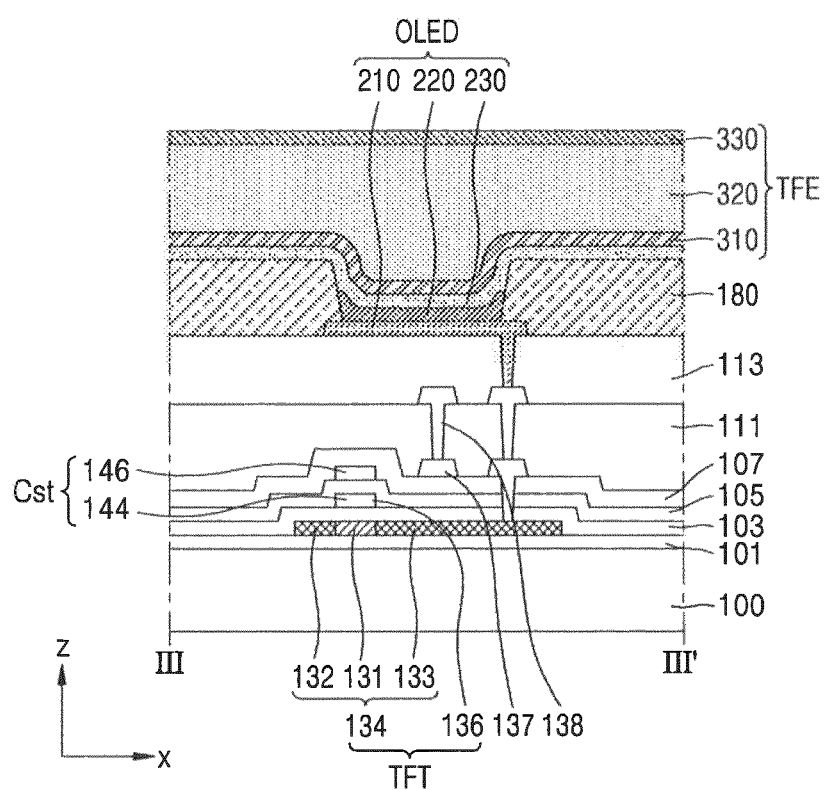
FIG. 4 is a cross-sectional view schematically illustrating a cross-section of the display panel taken along line III-III' of FIG. 3.

FIG. 4 is a cross-sectional view schematically illustrating a cross-section of the display panel taken along line III-III' of FIG. 3. For example, FIG. 4 is a cross-sectional view illustrating a cross-section of a pixel included in a display panel according to an exemplary embodiment of the present invention.

Referring to FIG. 4, a buffer layer 101 may be arranged on the substrate 100. The substrate 100 may include, for example, glass or polymer resin. The polymer resin may include, for example, polyethersulfone, polyacrylate, polyetherimide, polyethylene naphthalate, polyethylene terephthalate, polyphenylene sulfide, polyarylate, polyimide, polycarbonate, and/or cellulose acetate propionate. The substrate 100 including the polymer resin may be, for example, flexible, rollable, or bendable. For example, the substrate 100 may have a multilayer structure including an inorganic layer and a layer including the above polymer resin. The buffer layer 101 may be located on the substrate 100 to reduce or block the penetration of foreign materials or impurities, moisture, or external air from the bottom of the substrate 100 and may provide a flat surface on the substrate 100. The buffer layer 101 may include an inorganic material such as oxide or nitride, an organic material, or an organic/inorganic composite and may include a single-layer or multi-layer structure of an inorganic material and an organic material. A barrier layer for blocking the penetration of external air may be further included between the substrate 100 and the buffer layer 101.

Corresponding to the display area DA, a pixel circuit and an organic light emitting diode OLED electrically connected to the pixel circuit may be arranged over the substrate 100. The pixel circuit may include a thin film transistor TFT and a storage capacitor Cst.

The thin film transistor TFT may include a semiconductor layer 134 and a gate electrode 136 insulated from the semiconductor layer 134. The semiconductor layer 134 may include a channel area 131 overlapping the gate electrode 136 and a source area 132 and a drain area 133 arranged at both sides of the channel area 131 and including impurities of a higher concentration than the channel area 131. Here, the impurities may include N-type impurities or P-type impurities. The source area 132 and the drain area 133 may be understood as a source electrode and a drain electrode.

The semiconductor layer 134 may include an oxide semiconductor and/or a silicon semiconductor. When the semiconductor layer 134 includes an oxide semiconductor, the semiconductor layer 134 may include, for example, an oxide of at least one of indium (In), gallium (Ga), stannum (Sn), zirconium (Zr), vanadium (V), hafnium (Hf), cadmium (Cd), germanium (Ge), chromium (Cr), titanium (Ti), and zinc (Zn). For example, the semiconductor layer 134 may include InSnZnO (ITZO) or InGaZnO (IGZO). When the semiconductor layer 134 includes a silicon semiconductor, the semiconductor layer 134 may include, for example, amorphous silicon (a-Si) or low temperature poly-silicon (LTPS) crystallized from amorphous silicon (a-Si).

The gate electrode 136 may include a single layer or a multiple layer structure formed of at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu). The gate electrode 136 may be connected to a gate line for applying an electrical signal to the gate electrode 136.

A gate insulating layer 103 may be arranged between the semiconductor layer 134 and the gate electrode 136 to insulate the semiconductor layer 134 and the gate electrode 136 from each other. The gate insulating layer 103 may include an inorganic insulating material of at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The gate insulating layer 103 may include a single layer or a multiple layer structure including the above inorganic insulating material.

The storage capacitor Cst may include a lower electrode 144 and an upper electrode 146 arranged over the lower electrode 144. The lower electrode 144 and the upper electrode 146 of the storage capacitor Cst may be arranged to overlap each other. A first interlayer insulating layer 105 may be arranged between the lower electrode 144 and the upper electrode 146. The first interlayer insulating layer 105 may have a certain dielectric constant, and may include an inorganic insulating layer such as silicon oxynitride (SiON), silicon oxide ($SiO_x$), and/or silicon nitride ($SiN_x$). In addition, the first interlayer insulating layer 105 may include a single layer or a multiple layer structure.

FIG. 4 illustrates a case where the storage capacitor Cst overlaps the thin film transistor TFT and the lower electrode 144 is integrated with the gate electrode 136 of the thin film transistor TFT; however, the storage capacitor Cst may not overlap the thin film transistor TFT and the lower electrode 144 may be an independent component separate from the gate electrode 136 of the thin film transistor TFT.

A second interlayer insulating layer 107 may be arranged on the upper electrode 146 of the storage capacitor Cst. The second interlayer insulating layer 107 may include, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$) and may be a single layer or a multiple layer structure.

A first planarization layer 111 and a second planarization layer 113 may be arranged over the second interlayer insulating layer 107. The first planarization layer 111 and the second planarization layer 113 may planarize the top surface of the pixel circuit, thereby planarizing the surface on which the organic light emitting diode OLED is located.

The first planarization layer 111 may include a general-purpose polymer such as benzocyclobutene (BCB), polyimide, hexamethyldisiloxane (HMDSO), polymethylmethacrylate (PMMA), and/or polystyrene (PS), a polymer derivative having a phenolic group, an acrylic polymer, an imide-based polymer, an arylether-based polymer, an amide-based polymer, a fluorine-based polymers, a p-xylene-based polymer, a vinyl alcohol-based polymer, or any blend thereof. The first planarization layer 111 and the second planarization layer 113 may include an inorganic material. The first planarization layer 111 and the second planarization layer 113 may include, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$). When the first planarization layer 111 and the second planarization layer 113 include an inorganic material, chemical planarization polishing may be performed in some cases. The first planarization layer 111 and the second planarization layer 113 may include both an organic material and an inorganic material.

A second electrode layer 138 may be arranged on the first planarization layer 111. The second electrode layer 138 may include aluminum (Al), copper (Cu), and/or titanium (Ti) and may be a multiple layer structure or a single layer. In an exemplary embodiment of the present invention, the second electrode layer 138 may include a multilayer structure of Ti/Al/Ti.

FIG. 4 illustrates a structure in which a first electrode layer 137 arranged under the first planarization layer 111 is further included. For example, the first electrode layer 137 may be disposed on the second interlayer insulating layer 107. In an exemplary embodiment of the present invention, the second electrode layer 138 may be the driving voltage line PL described above, and the first electrode layer 137 may be a lower driving voltage line. The first electrode layer 137 may be electrically connected to the second electrode layer 138 through a contact hole passing through the first planarization layer 111, to prevent a voltage enhancement of the driving voltage.

In the display area DA of the substrate 100, an organic light emitting diode OLED including a pixel electrode 210, an intermediate layer 220, and an opposite electrode 230 arranged to face the pixel electrode 210 with the intermediate layer 220 therebetween. In addition, the organic light emitting diode OLED may be located on the second planarization layer 113.

The pixel electrode 210 may be arranged on the second planarization layer 113. The pixel electrode 210 may include, for example, a (semi)transparent electrode or a reflective electrode. In an exemplary embodiment of the present invention, the pixel electrode 210 may include a reflective layer formed of Ag, Mg, Al, Pt, Pd, Au, Ni, Nd, Ir, Cr, or any compound thereof and a transparent or semitransparent electrode layer formed on the reflective layer. The transparent or semitransparent electrode layer may include at least one of indium tin oxide (ITO), indium zinc oxide (IZO), zinc oxide (ZnO), indium oxide ($In_2O_3$), indium gallium oxide (IGO), and/or aluminum zinc oxide (AZO). In an exemplary embodiment of the present invention, the pixel electrode 210 may include a stack structure of ITO/Ag/ITO.

A pixel definition layer 180 may be arranged over the second planarization layer 113, and the pixel definition layer 180 may have an opening to expose a central portion of the pixel electrode 210, thereby providing an emission area of the pixel. In addition, the pixel definition layer 180 may increase a distance between the edge of the pixel electrode 210 and the opposite electrode 230 over the pixel electrode 210 to prevent an arc or the like from occurring at the edge of the pixel electrode 210. For example, the pixel definition layer 180 may be disposed between the pixel electrode 210 and the opposite electrode 230. For example, the pixel definition layer 180 may be formed of an organic insulating material such as polyimide, polyamide, acrylic resin, benzocyclobutene, hexamethyldisiloxane (HMDSO), or phenol resin by spin coating or the like.

A spacer may be arranged on the pixel definition layer 180. The spacer may prevent the organic light emitting diode OLED from being damaged by the deflection of a mask in a manufacturing process using the mask. For example, the spacer may be formed of an organic insulating material such as polyimide, polyamide, acrylic resin, benzocyclobutene, hexamethyldisiloxane (HMDSO), or phenol resin by spin coating or the like and may include a single layer or a multiple layer structure.

The intermediate layer 220 may be arranged on the pixel electrode 210 exposed by the pixel definition layer 180. For example, the intermediate layer 220 may be disposed in the opening of the pixel definition layer 180 that exposes the central portion of the pixel electrode 210. The intermediate layer 220 may include an emission layer, and functional layers such as a hole transport layer (HTL), a hole injection layer (HIL), an electron transport layer (ETL), and an electron injection layer (EIL). In addition, the functional layers may be disposed under or over the emission layer.

The emission layer may include, for example, an organic material including a fluorescent or phosphorescent material emitting red, green, blue, or white light. The emission layer may include a low-molecular weight organic material or a high-molecular weight organic material.

When the emission layer includes a low-molecular weight organic material, the intermediate layer 220 may include a structure in which an HIL, an HTL, an emission layer (EML), and an ETL, an EIL, and the like are stacked in a single or complex structure, and the low-molecular organic material may include various organic materials such as copper phthalocyanine (CuPc), N,N'-di(naphthalene-1-yl)-N,N'-diphenyl-benzidine(N,N'-Di(napthalene-1-yl)-N,N'-diphenyl-benzidine (NPB), and tris-8-hydroxyquinoline aluminum (Alq3). These layers may be formed by vacuum deposition.

When the emission layer includes a high-molecular weight organic material, the intermediate layer 220 may have a structure including an HTL and an EML. In this case, the HTL may include PEDOT, and the EML may include a polymer material such as polyvinylvinylene (PPV) and polyfluorene. The emission layer may be formed by screen printing, inkjet printing, laser induced thermal imaging (LITI), or the like.

The pixel electrode 210 may be provided as a plurality of pixel electrodes 210, and the intermediate layer 220 may be arranged to correspond to each of the plurality of pixel electrodes 210. However, the present invention is not limited thereto. The intermediate layer 220 may be modified in various ways such as to include an integral layer over the plurality of pixel electrodes 210. In an exemplary embodiment of the present invention, the intermediate layer 220 may be arranged corresponding to each of the plurality of pixel electrodes 210, and the functional layer(s) other than the intermediate layer 220 may be integrally formed over the plurality of pixel electrodes 210.

The opposite electrode 230 may be arranged on the intermediate layer 220. For example, the opposite electrode 230 may be arranged on the intermediate layer 220 and may be arranged to entirely cover the intermediate layer 220.

The opposite electrode 230 may be arranged in the entire display area DA. For example, the opposite electrode 230 may be integrally formed to cover a plurality of pixels. For example, the opposite electrode 230 may be a common electrode of the plurality of pixels.

For example, the opposite electrode 230 may include a transparent electrode or a reflective electrode. In an exemplary embodiment of the present invention, the opposite electrode 230 may include a transparent or semitransparent electrode, and may include a thin metal layer having a low work function and including Li, Ca, LiF/Ca, LiF/Al, Al, Ag, Mg, or any compound thereof. In addition, a transparent conductive oxide (TCO) layer such as ITO, IZO, ZnO, or $In_2O_3$ may be arranged on the thin metal layer.

When the pixel electrode 210 is provided as a reflective electrode and the opposite electrode 230 is provided as a transparent electrode, the light emitted from the intermediate layer 220 may be emitted toward the opposite electrode 230 such that the display apparatus 1 may be a top-emission type. In an exemplary embodiment of the present invention, when the pixel electrode 210 is provided as a transparent or semitransparent electrode and the opposite electrode 230 is provided as a reflective electrode, the light emitted from the intermediate layer 220 may be emitted toward the substrate 100 such that the display apparatus 1 may be a bottom-emission type. However, the present invention is not limited thereto, and the display apparatus 1, according to an exemplary embodiment of the present invention, may be a double-side emission type that emits light in both directions corresponding to the top side and the bottom side.

A thin film encapsulation layer TFE may be arranged on the opposite electrode 230 to protect the organic light emitting diode OLED from external moisture and oxygen. The thin film encapsulation layer TFE may include at least one organic encapsulation layer and at least one inorganic encapsulation layer. The thin film encapsulation layer TFE may cover the display area DA and may be arranged to extend toward the first non-display area NDA1 to cover a portion of the first non-display area NDA1. For example, the thin film encapsulation layer TFE may entirely cover the display area DA.

The thin film encapsulation layer TFE may include a first inorganic encapsulation layer 310, a second inorganic encapsulation layer 330 arranged over the first inorganic encapsulation layer 310, and an organic encapsulation layer 320 between the first inorganic encapsulation layer 310 and the second inorganic encapsulation layer 330.

The first inorganic encapsulation layer 310 and the second inorganic encapsulation layer 330 may include one or more inorganic materials such as aluminum oxide, titanium oxide, tantalum oxide, hafnium oxide, zinc oxide, silicon oxide, silicon nitride, and/or silicon oxynitride. The first inorganic encapsulation layer 310 and the second inorganic encapsulation layer 330 may include a single layer or a multiple layer structure including the above material. The first inorganic encapsulation layer 310 and the second inorganic encapsulation layer 330 may include the same material or may include different materials from each other.

The organic encapsulation layer 320 may include a monomer-based material or a polymer-based material. The organic encapsulation layer 320 may include polyethyleneterephthalate, polyethylenenaphthalate, polycarbonate, polyimide, polyethylenesulfonate, polyoxymethylene, polyarylate, hexamethyldisiloxane, acrylic resin (e.g., polymethylmethacrylate or polyacrylic acid), or any combination thereof.

Figure 5:
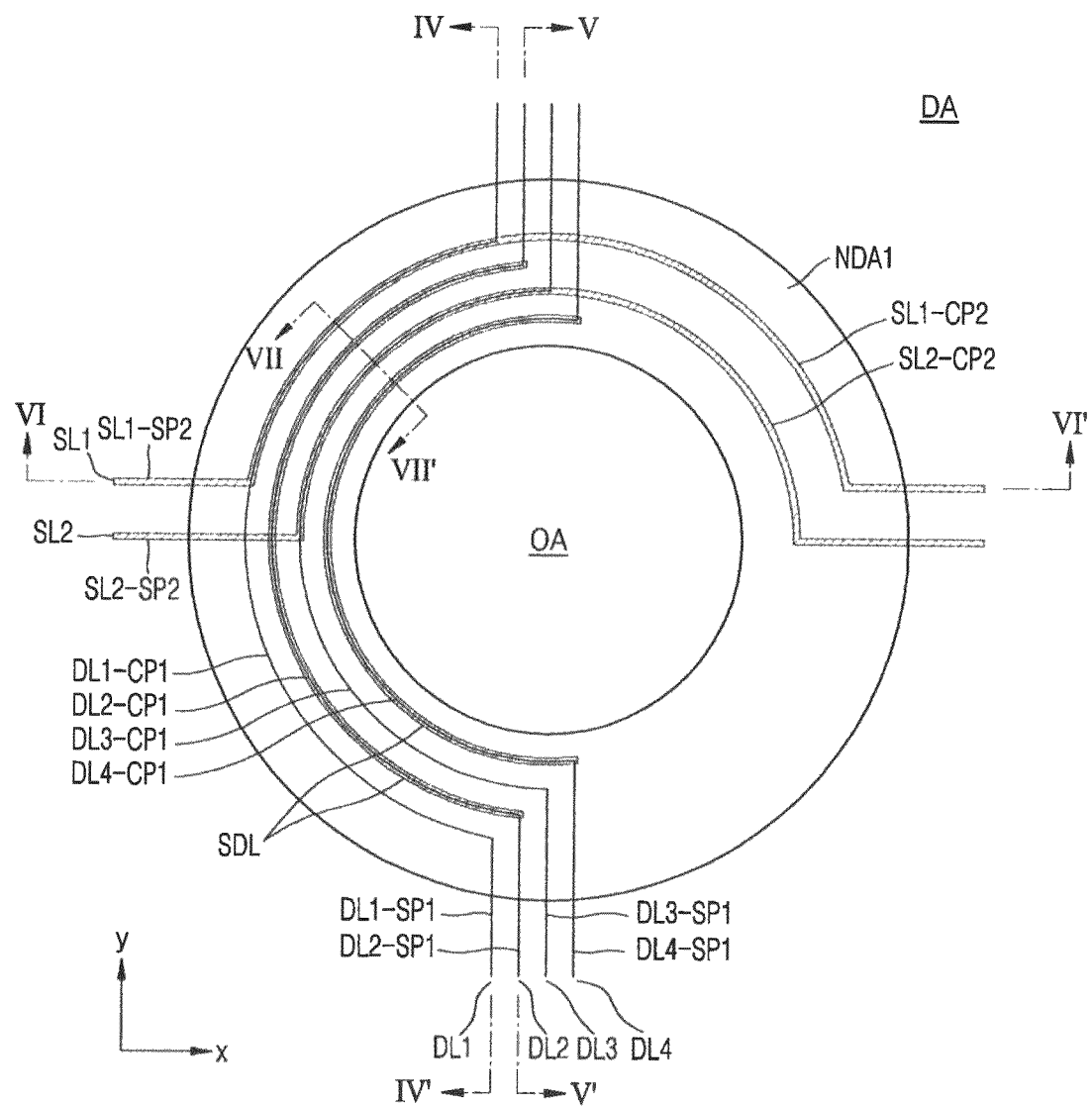
FIG. 5 is a plan view illustrating lines around an opening area in an exemplary embodiment of the present invention.

FIG. 5 is a plan view illustrating lines around an opening area in an exemplary embodiment of the present invention.

Referring to FIG. 5, the display panel 10 according to an exemplary embodiment of the present invention may include a substrate 100 including an opening area OA, a first non-display area NDA1 surrounding the opening area OA, and a display area DA outside the first non-display area NDA1. Further, the display panel 10, according to an exemplary embodiment of the present invention, may include a plurality of first lines extending in a first direction (e.g., a y direction) and a plurality of second lines extending in a second direction (e.g., an x direction) intersecting the first direction (e.g., y direction). In addition, the plurality of first lines may include a first bypass portion CP1 bypassing (or, e.g., extending) along the edge of the opening area OA. Further, the plurality of second lines may include a second bypass portion CP2 bypassing along the edge of the opening area OA. Further, the display panel 10, according to an exemplary embodiment of the present invention, may include a shield layer SDL arranged over the first non-display area NDA1 to overlap the first bypass portion CP1.

In an exemplary embodiment of the present invention, the plurality of first lines may include a first data line DL1, a second data line DL2, a third data line DL3, and a fourth data line DL4. In addition, the plurality of second lines may include a first scan line SL1 and a second scan line SL2. In FIG. 5, some data lines DL1 to DL4 are illustrated as bypassing along the left edge of the opening area OA; however, they may substantially bypass along the right edge of the opening area OA and the number of data lines bypassing along the left or right sides of the opening area OA may be four or more. In addition, some scan lines SL1 and SL2 are illustrated as bypassing along the upper edge of the opening area OA; however, they may substantially bypass along the lower edge of the opening area OA and the number of scan lines bypassing along the upper or lower sides of the opening area OA may be two or more.

Some data lines DL1 to DL4 may bypass around the opening area OA. For example, the data lines DL to DL4 may respectively include first extension portions DL1-SP1, DL2-SP1, DL3-SP1, and DL4-SP1 extending in the first direction (e.g., the y direction) and first bypass portions DL1-CP1, DL2-CP1, DL3-CP1, and DL4-CP1 bypassing along the edge of the opening area OA. The first bypass portions DL1-CP1, DL2-CP1, DL3-CP1, and DL4-CP1 of the data lines DL1 to DL4 may be located in the first non-display area NDA1.

Some scan lines SL1 and SL2 may bypass around the opening area OA. For example, the scan lines SL1 and SL2 may respectively include second extension portions SL1-SP2 and SL2-SP2 extending in the second direction (e.g., the x direction) intersecting with the first direction (e.g., the y direction) and second bypass portions SL1-CP2 and SL2-CP2 bypassing along the edge of the opening area OA. The second bypass portions SL1-CP2 and SL2-CP2 of the scan lines SL1 and SL2 may be located in the first non-display area NDA1.

Figure 6:
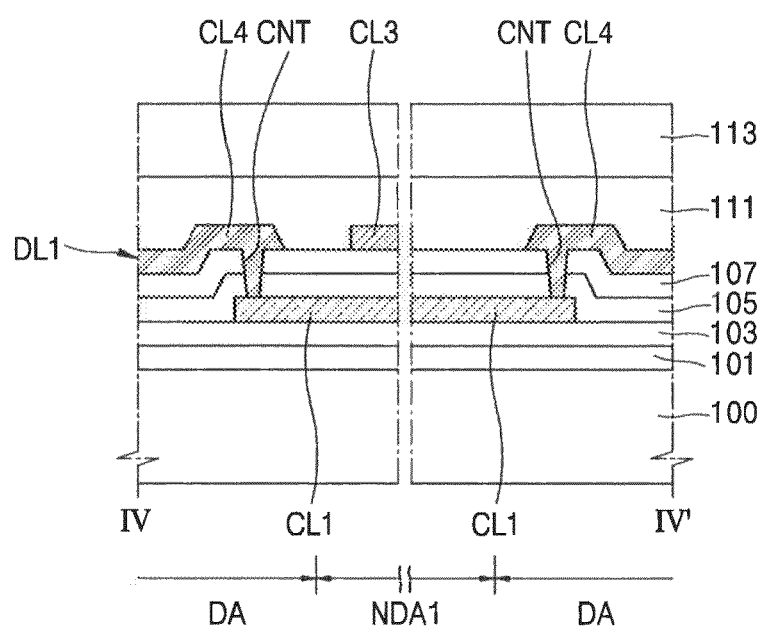
FIG. 6 is a cross-sectional view schematically illustrating a cross-section of a region taken along line IV-IV' of FIG. 5.
Figure 7:
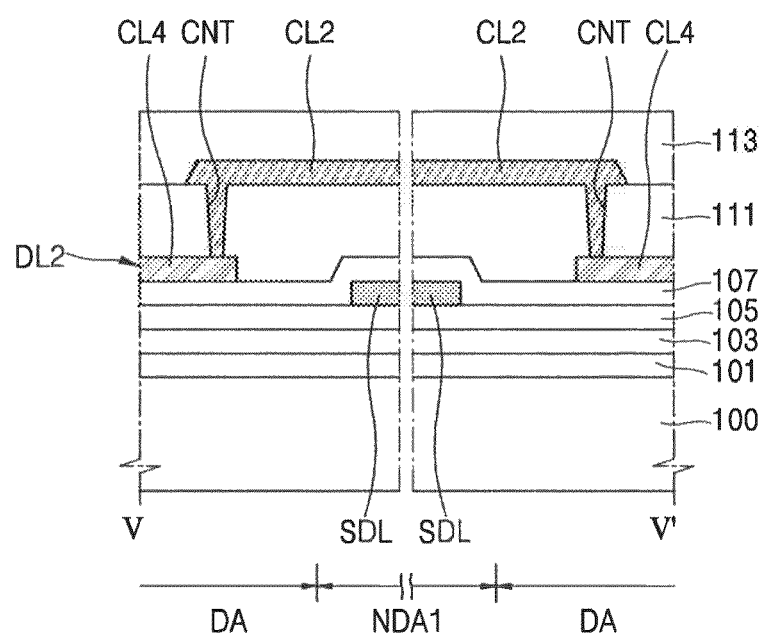
FIG. 7 is a cross-sectional view schematically illustrating a cross-section of a region taken along line V-V of FIG. 5.

FIG. 6 is a cross-sectional view schematically illustrating a cross-section of a region taken along line IV-IV of FIG. 5, and FIG. 7 is a cross-sectional view schematically illustrating a cross-section of a region taken along line V-V of FIG. 5.

Referring to FIGS. 5, 6, and 7, the data lines DL1 to DL4 may include a first conductive line CL1 or a second conductive line CL2 including a first bypass portion bypassing over the first non-display area NDA1. The first conductive line CL1 may include a first bypass portion bypassing the edge of the opening area OA, and the second conductive line CL2 may include a first bypass portion bypassing the edge of the opening area OA.

The first conductive line CL1 and the second conductive line CL2 including the first bypass portion may be alternately arranged in different layers. For example, the data lines (e.g., the first data line DL1 and the second data line DL2) that are most adjacent to each other among the data lines DL1 to DL4 may include conductive lines arranged in different layers over the first non-display area NDA1. Accordingly, the pitch between the data lines DL1 to DL4 may be further reduced and the non-display area (referred to as, for example, a dead space) around the opening area OA may be effectively reduced.

Referring to FIG. 6, based on the first data line DL, the first data line DL1 may include a first conductive line CL1 located over the first non-display area NDA1 and a fourth conductive line CL4 located over the display area DA. The first conductive line CL1 may be arranged on the gate insulating layer 103 and may include the same material as the gate electrode of FIG. 4. The fourth conductive line CL4 may be arranged on the second interlayer insulating layer 107 and may include the same material as the first electrode layer of FIG. 4.

The first conductive line CL1 and the fourth conductive line CL4 may be electrically connected to each other by contacting each other through a contact hole CNT. The contact hole CNT of FIG. 6 may penetrate the first interlayer insulating layer 105 and the second interlayer insulating layer 107. A first data signal transmitted through the first data line DL1 may be transmitted from the fourth conductive line CL4 (e.g., above the opening area OA, from a plan view) to the first conductive line CL1 extending around the opening area OA, and then to the fourth conductive line CL4 below the opening area OA, from a plan view.

Referring to FIG. 7, based on the second data line DL2, the second data line DL2 may include a second conductive line CL2 located over the first non-display area NDA1 and a fourth conductive line CL4 located over the display area DA. The second conductive line CL2 may be arranged on the first planarization layer 111 and may include the same material as the second electrode layer of FIG. 4, and the fourth conductive line CL4 may be arranged on the second interlayer insulating layer 107 and may include the same material as the first electrode layer of FIG. 4.

The second conductive line CL2 and the fourth conductive line CL4 may be electrically connected to each other by contacting each other through a contact hole CNT. The contact hole CNT of FIG. 7 may penetrate the first planarization layer 111. A second data signal transmitted through the second data line DL2 may be transmitted from the fourth conductive line CL4 (e.g., above the opening area OA, from a plan view) to the first conductive line CL1 extending around the opening area OA, and then to the fourth conductive line CL4 below the opening area OA, from a plan view.

A third conductive line CL3 is illustrated as being arranged on the second interlayer insulating layer 107 on the left side of FIG. 6; however, when some scan lines bypass along the lower side of the opening area OA, from a plan view, a third conductive line CL3 may also be arranged on the right side of FIG. 6.

The fourth conductive line CL4 of FIG. 6 and the fourth conductive line CL4 of FIG. 7 may be different signal lines arranged on the same layer, the fourth conductive line CL4 of FIG. 6 may be understood as a portion of the first data line DL1, and the fourth conductive line CL4 of FIG. 7 may be understood as a portion of the second data line DL2.

In addition, although the first data line DL and the second data line DL2 are illustrated and described as examples in FIGS. 6 and 7, this structure may be repeatedly applied to the adjacent data lines DL3 and DL4. For example, the third data line DL3 may have a cross-sectional structure similar to that of the first data line DL1, and the fourth data line DL4 may have a cross-sectional structure similar to that of the second data line DL2.

Figure 8:
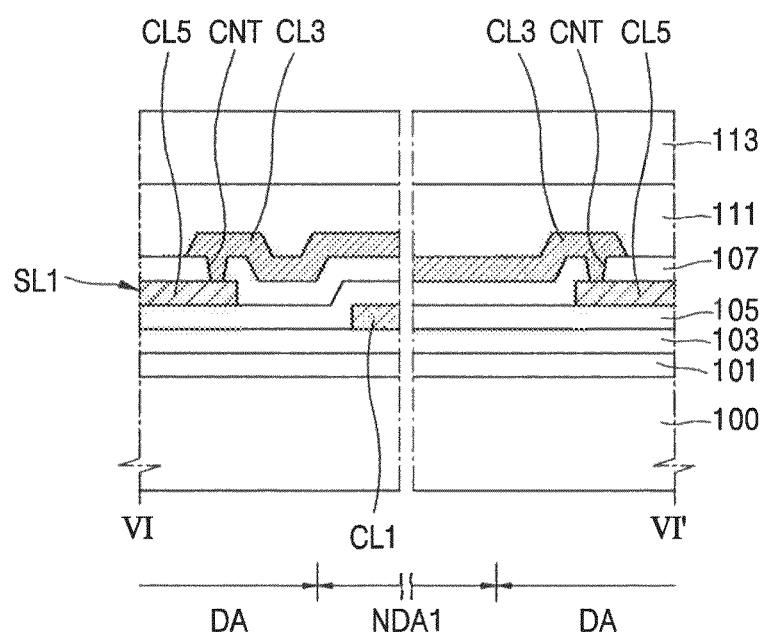
FIG. 8 is a cross-sectional view schematically illustrating a cross-section of a region taken along line VI-VI' of FIG. 5.

FIG. 8 is a cross-sectional view schematically illustrating a cross-section of a region taken along line VI-VI' of FIG. 5.

Referring to FIGS. 5 and 8, the scan lines SL1 and SL2 may include a third conductive line CL3 including a second bypass portion bypassing over the first non-display area NDA1. In addition, the third conductive line CL3 may include a second bypass portion bypassing the edge of the opening area OA.

Referring to FIG. 8, based on the first scan line SL1, the first scan line SL1 may include a third conductive line CL3 located over the first non-display area NDA1 and a fifth conductive line CL5 located over the display area DA. The third conductive line CL3 may be arranged on the second interlayer insulating layer 107 and may include the same material as the first electrode layer of FIG. 4. The fifth conductive line CL5 may be arranged on the first interlayer insulating layer 105 and may include the same material as the upper electrode of FIG. 4. In an exemplary embodiment of the present invention, the fifth conductive line CL5 may be arranged over the gate insulating layer 103 and may include the same material as the gate electrode of FIG. 4.

The third conductive line CL3 and the fifth conductive line CL5 may be electrically connected to each other by contacting each other through a contact hole CNT. The contact hole CNT of FIG. 8 may penetrate the second interlayer insulating layer 107. A first scan signal transmitted through the first scan line SL1 may be transmitted from the fifth conductive line CL5 at the left side of the opening area OA through the third conductive line CL3 to the fifth conductive line CL5 at the right side of the opening area OA.

The first conductive line CL1 is illustrated as being arranged on the gate insulating layer 103 on the left side of FIG. 8 in the first non-display area NDA1; however, when some data lines bypass along the right side of the opening area OA, the first conductive line CL1 may also be arranged on the right side of FIG. 8 in the first non-display area NDA1.

The first scan line SL1 is illustrated and described as an example in FIG. 8; however, the structure illustrated in FIG. 8 may be repeatedly applied to the adjacent second scan line SL2. For example, the second scan line SL2 may have a cross-sectional structure similar to that of the first scan line SL1.

Referring to FIG. 5, the shield layer SDL may be arranged over the first non-display area NDA1 to overlap the second and fourth data lines DL2 and DL4. However, the present invention is not limited thereto, and for example, the shield layer SDL may overlap the first, second, third and fourth data lines DL1 to DL4 For example, the shield layer SDL may be arranged over the first non-display area NDA1 to at least partially overlap the first conductive line CL1 and the second conductive line CL2. The shield layer SDL may have a direct current voltage, and for example, the shield layer SDL may be the first power ELVDD or the second power ELVSS. In an exemplary embodiment of the present invention, the shield layer SDL may not overlap the opening area OA and may be arranged in the first non-display area NDA1.

Figure 9:
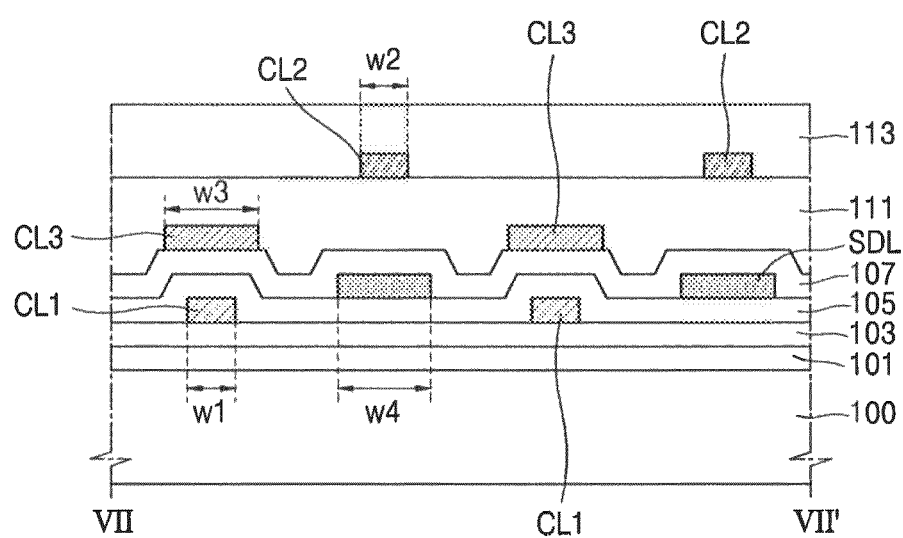
FIG. 9 is a cross-sectional view schematically illustrating a cross-section of a region taken along line VII-VII' of FIG. 5.

FIG. 9 is a cross-sectional view schematically illustrating a cross-section of a region taken along line VII-VII' of FIG. 5.

In an exemplary embodiment of the present invention, the first data line DL1 of FIG. 5 may include a first conductive line CL1 arranged on the gate insulating layer 103, and the second data line DL2 adjacent to the first data line DL1 may include a second conductive line CL2 arranged on the first planarization layer 111. The third data line DL3 adjacent to the second data line DL2 may include a first conductive line CL1 arranged on the gate insulating layer 103, and the fourth data line DL4 adjacent to the third data line DL3 may include a second conductive line CL2 arranged on the first planarization layer 111. The first scan line SL and the second scan line SL2 may each include a third conductive line CL3 arranged on the second interlayer insulating layer 107. For convenience of description, hereinafter, it may be assumed that the first data line DL1 and the third data line DL3 are the first conductive line CL1, and that the second data line DL2 and the fourth data line DL4 are the second conductive line CL2. In addition, it may be assumed for convenience of description that the first scan line SL1 and the second scan line SL2 are the third conductive line CL3. However, the present invention is not limited thereto.

In a comparative example, when all data lines are arranged in the same layer, it may not be very easy to narrow the interval of data lines to a certain distance or less based on the width of data lines and the parasitic cap therebetween. For this reason, there may be a limitation in reducing a non-display area (e.g., dead space) around an opening area.

In addition, even when adjacent data lines are alternately arranged in different layers, because a luminance deviation occurs due to the coupling between adjacent data lines, it may not be very easy to narrow the interval of data lines to a certain distance or less.

To solve the above limitations, according to the present invention, adjacent data lines may be alternately arranged in different layers and data lines may be shielded by a shield layer and a scan line to prevent the occurrence of a luminance deviation due to coupling between adjacent data lines and to reduce a non-display area (e.g., dead space) around an opening area.

Referring to FIG. 9, the first conductive line CL1 and the second conductive line CL2 may be alternately arranged in different layers. For example, the first conductive line CL1 may be arranged on the gate insulating layer 103, and the second conductive line CL2 may be arranged on the first planarization layer 111 different from the first conductive line CL1.

The third conductive line CL3 may be arranged over the first conductive line CL1 to overlap the first conductive line CL1, and the shield layer SDL may be arranged under the second conductive line CL2 to overlap the second conductive line CL2. In an exemplary embodiment of the present invention, a width w3 of the third conductive line CL3 may be greater than a width w1 of the first conductive line CL1, and a width w4 of the shield layer SDL may be greater than a width w2 of the second conductive line CL2. Because the width w3 of the third conductive line CL3 is greater than the width w1 of the first conductive line CL1, the third conductive line CL3 may shield the first conductive line CL1, and because the width w4 of the shield layer SDL is greater than the width w2 of the second conductive line CL2, the shield layer SDL may shield the second conductive line CL2. Because the third conductive line CL3 shields the first conductive line CL1 and the shield layer SDL shields the second conductive line CL2, it may be possible to prevent the occurrence of a luminance deviation due to coupling between adjacent data lines and to reduce the non-display area (e.g., dead space) around the opening area.

Figure 10:
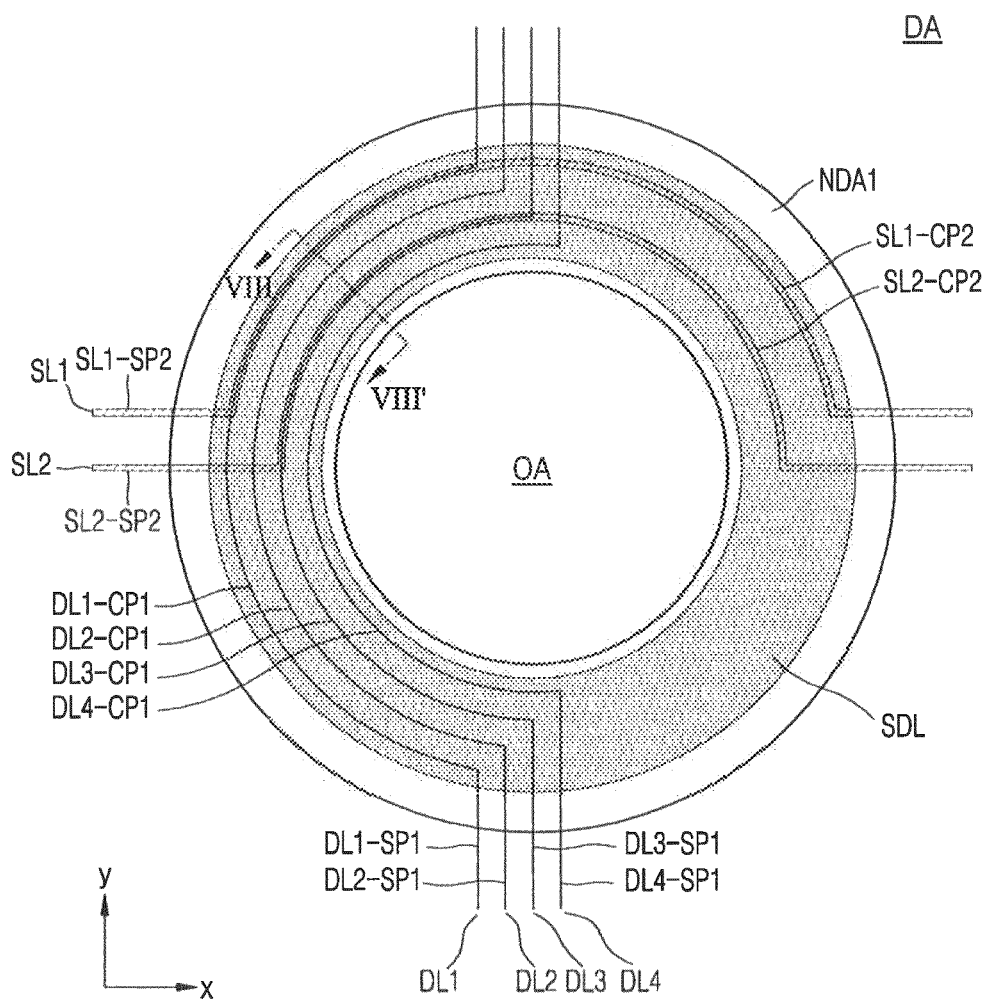
FIG. 10 is a plan view illustrating lines around an opening area in an exemplary embodiment of the present invention.
Figure 11:
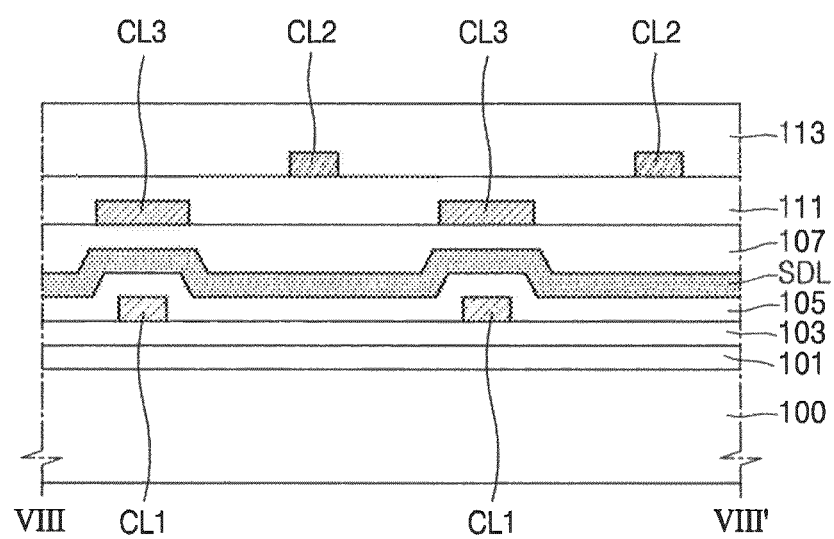
FIG. 11 is a cross-sectional view schematically illustrating a cross-section of a region taken along line VIII-VIII' of FIG. 10.

FIG. 10 is a plan view illustrating lines around an opening area in an exemplary embodiment of the present invention, and FIG. 11 is a cross-sectional view schematically illustrating a cross-section of a region taken along line VIII-VIII' of FIG. 10.

The exemplary embodiment of FIG. 10 is different from the above exemplary embodiment of FIG. 5 in that the shield layer SDL overlaps the first conductive line CL1 and the second conductive line CL2. The other configurations are the same as those of FIG. 5, and thus, the difference between FIG. 10 and FIG. 5 will be mainly described below with regard to the shield layer SDL.

Referring to FIGS. 10 and 11, the shield layer SDL may be arranged in the first non-display area NDA1 to at least partially overlap the first conductive line CL1 and the second conductive line CL2. For example, the shield layer SDL may completely overlap the first conductive line CL1 and the second conductive line CL2; however, the present invention is not limited thereto. The shield layer SDL may be arranged on the first interlayer insulating layer 105 and may include the same material as the upper electrode (e.g., 146 of FIG. 4), and the third conductive line CL3 may be arranged on the second interlayer insulating layer 107 and may include the same material as the first electrode layer.

The shield layer SDL may be arranged in the first non-display area NDA1 and may include a hole corresponding to the opening area OA. In an exemplary embodiment of the present invention, a diameter of the hole may be greater than a diameter of the opening area OA. The shield layer SDL may be between the first conductive line CL1 and the second conductive line CL2 including the first bypass portions.

The shield layer SDL may be arranged between the first conductive line CL1 and the second conductive line CL2 in a relatively large area to maximize the shielding effect, thereby preventing the occurrence of a luminance deviation due to coupling between adjacent data lines and reducing the non-display area (e.g., dead space) around the opening area.

Figure 12:
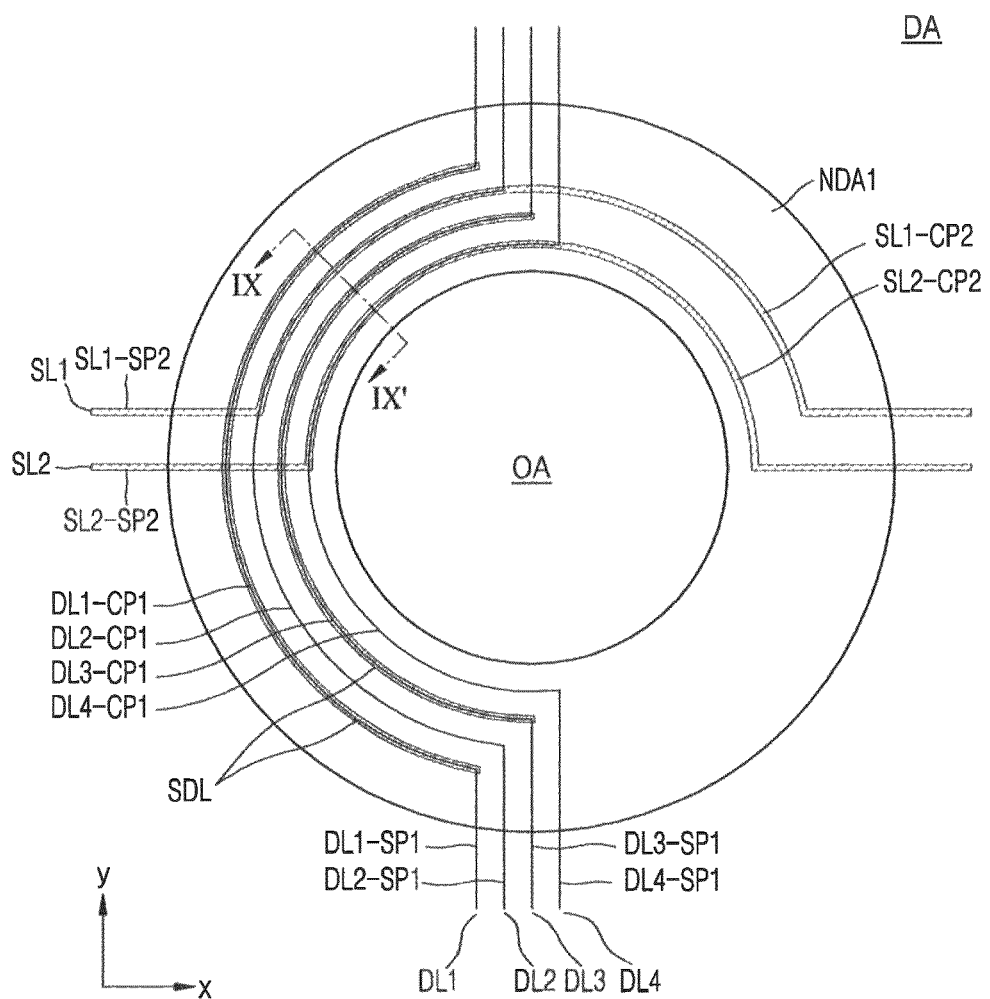
FIG. 12 is a plan view illustrating lines around an opening area in an exemplary embodiment of the present invention.
Figure 13:
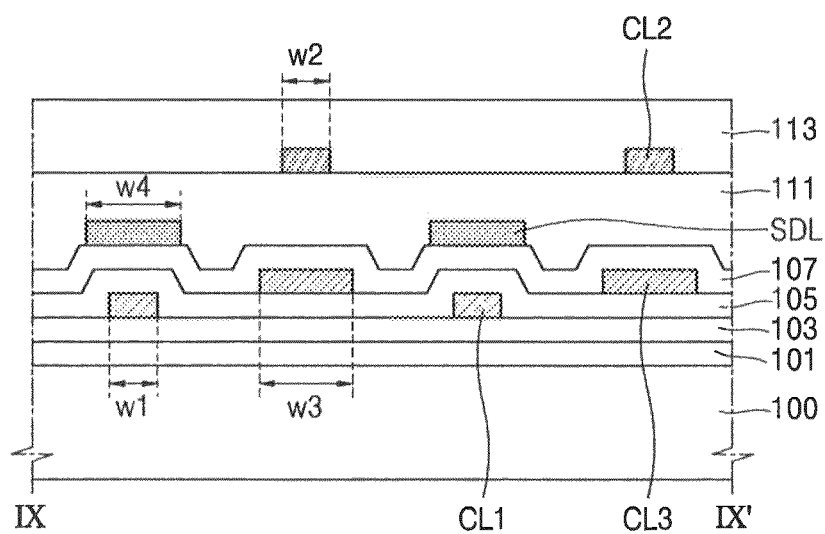
FIG. 13 is a cross-sectional view schematically illustrating a cross-section of a region taken along line IX-IX' of FIG. 12.

FIG. 12 is a plan view illustrating lines around an opening area in an exemplary embodiment of the present invention, and FIG. 13 is a cross-sectional view schematically illustrating a cross-section of a region taken along line IX-IX' of FIG. 12.

The exemplary embodiment of FIG. 12 is different from the above exemplary embodiment of FIG. 5 in that the first conductive layer CL1 and the shield layer SDL overlap each other and the second conductive line CL2 and the third conductive line CL3 overlap each other. The other configurations are the same as those of FIG. 5, and thus, the difference between FIG. 12 and FIG. 5 will be mainly described below with regard to the fact that the first conductive line CL1 and the shield layer SDL overlap each other and the second conductive line CL2 and the third conductive line CL3 overlap each other.

Referring to FIGS. 12 and 13, the shield layer SDL may be arranged over the first conductive line CL1 to overlap the first conductive line CL1, and the third conductive line CL3 may be arranged under the second conductive line CL2 to overlap the second conductive line CL2. In an exemplary embodiment of the present invention, a width w4 of the shield layer SDL may be greater than a width w1 of the first conductive line CL1, and a width w3 of the third conductive line CL3 may be greater than a width w2 of the second conductive line CL2. Because the width w4 of the shield layer SDL is greater than the width w1 of the first conductive line CL1, the shield layer SDL may shield the first conductive line CL1, and because the width w3 of the third conductive line CL3 is greater than the width w2 of the second conductive line CL2, the third conductive line CL3 may shield the second conductive line CL2. Because the shield layer SDL shields the first conductive line CL1 and the third conductive line CL3 shields the second conductive line CL2, it may be possible to prevent the occurrence of a luminance deviation due to coupling between adjacent data lines and to reduce the non-display area (e.g., dead space) around the opening area.

Figure 14:
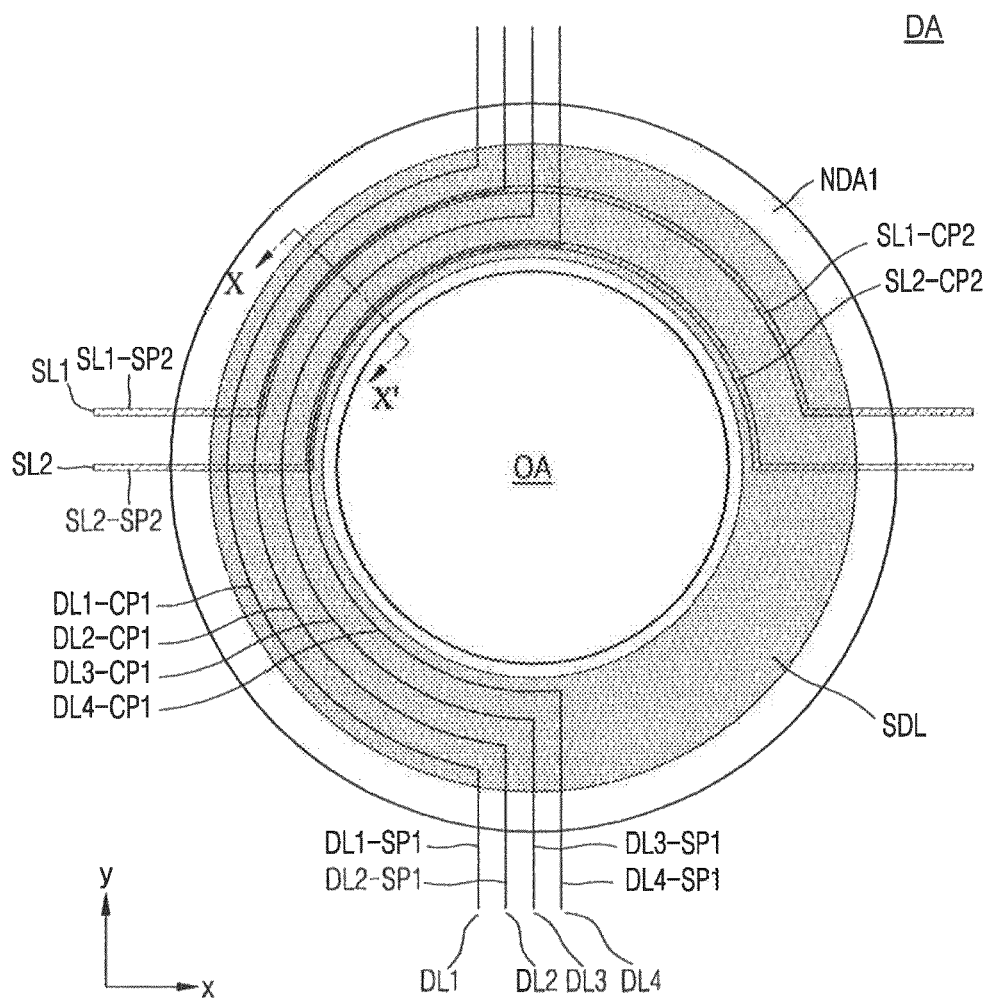
FIG. 14 is a plan view illustrating lines around an opening area in an exemplary embodiment of the present invention.
Figure 15:
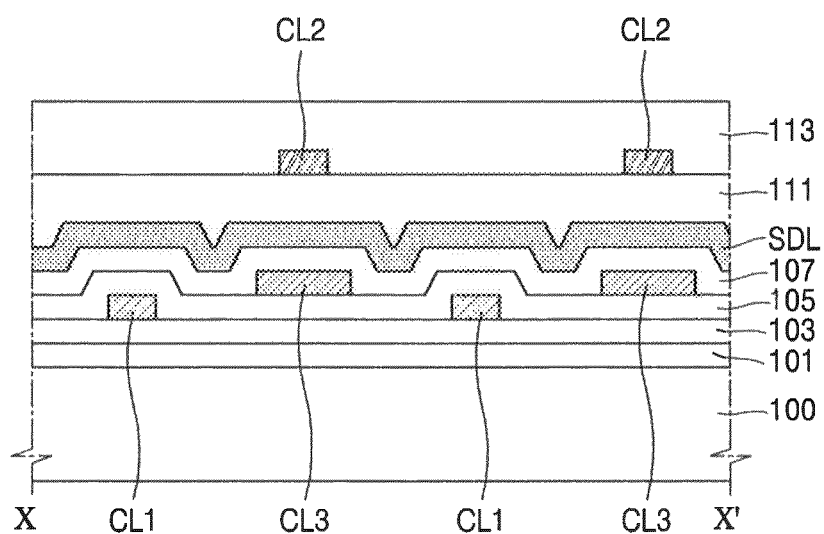
FIG. 15 is a cross-sectional view schematically illustrating a cross-section of a region taken along line X-X' of FIG. 14.

FIG. 14 is a plan view illustrating lines around an opening area in an exemplary embodiment of the present invention, and FIG. 15 is a cross-sectional view schematically illustrating a cross-section of a region taken along line X-X' of FIG. 14.

The exemplary embodiment of FIG. 14 is different from the above exemplary embodiment of FIG. 12 in that the shield layer SDL overlaps the first conductive line CL1 and the second conductive line CL2. The other configurations are the same as those of FIG. 12, and thus, the difference between FIG. 14 and FIG. 12 will be mainly described below with regard to the shield layer SDL.

Referring to FIGS. 14 and 15, the shield layer SDL may be arranged in the first non-display area NDA1 to at least partially overlap the first conductive line CL1 and the second conductive line CL2. For example, the shield layer SDL may completely overlap the first conductive line CL1 and the second conductive line CL2; however, the present invention is not limited thereto. The shield layer SDL may be arranged on the second interlayer insulating layer 107 and may include the same material as the first electrode layer (e.g., 137 of FIG. 4), and the third conductive line CL3 may be arranged on the first interlayer insulating layer 105 and may include the same material as the upper electrode (e.g., 146 of FIG. 4).

The shield layer SDL may be arranged in the first non-display area NDA1 and may include a hole corresponding to the opening area OA. In an exemplary embodiment of the present invention, the diameter of the hole may be greater than the diameter of the opening area OA. The shield layer SDL may be between the first conductive line CL1 and the second conductive line CL2 including the first bypass portions.

The shield layer SDL may be arranged between the first conductive line CL1 and the second conductive line CL2 in a relatively large area to maximize the shielding effect, thereby preventing the occurrence of a luminance deviation due to coupling between adjacent data lines and reducing the non-display area (e.g., dead space) around the opening area.

According to an exemplary embodiment of the present invention, to solve a limitation such as the occurrence of a luminance deviation due to coupling between adjacent data lines, adjacent data lines may be alternately arranged on different layers and a scan line and a shield layer may be used to shield the data lines arranged on different layers. Accordingly, it may be possible to provide a display panel and a display apparatus including the display panel that may prevent the occurrence of a coupling between adjacent data lines and to increase product reliability.

According to an exemplary embodiment of the present invention described above, it is possible to implement a display panel, of a display apparatus, having increased reliability and a reduced non-display area. However, the spirit and scope of the present invention is not limited to these effects.

While the present invention has been described with reference to exemplary embodiments thereof, it will be understood by those of ordinary skill in the art that various changes in form and details may be made thereto without departing from the spirit and scope of the present invention.

What is claimed is:

1. A display panel comprising:
a substrate including an opening area, a non-display area at least partially surrounding the opening area, and a display area at least partially surrounding the non-display area;
a plurality of first lines extending in a first direction, wherein each of the plurality of first lines includes a first bypass portion extending along an edge of the opening area;
a plurality of second lines extending in a second direction intersecting with the first direction, wherein each of the plurality of second lines includes a second bypass portion extending along the edge of the opening area; and
a shield layer arranged in the non-display area and overlapping at least one first bypass portion,
wherein each of the plurality of first lines includes a first conductive line or a second conductive line located in the non-display area, wherein each of the first conductive line and the second conductive line includes the first bypass portion, wherein the first conductive line and the second conductive line are alternately arranged on different layers from each other, wherein the shield layer is disposed below the second conductive line, and
wherein each of the plurality of second lines includes a third conductive line located in the non-display area, wherein each of the third conductive lines includes the second bypass portion, and wherein the third conductive lines at least partially overlap the first conductive line or the second conductive line, wherein the shield layer is disposed below the third conductive lines.

2. The display panel of claim 1, wherein the third conductive line is arranged on a different layer than that of the shield layer.

3. The display panel of claim 2, wherein a direct current voltage is applied to the shield layer.

4. The display panel of claim 1, wherein the shield layer does not overlap the opening area.

5. The display panel of claim 1, wherein a width of the third conductive line is greater than a width of the first conductive line or the second conductive line.

6. The display panel of claim 1, wherein a width of the shield layer is greater than a width of the first conductive line or the second conductive line.

7. The display panel of claim 1, further comprising
a plurality of display elements arranged in the display area; and
a thin film transistor arranged in the display area and connected to each of the plurality of display elements;
a storage capacitor arranged in the display area and connected to each of the plurality display elements,
wherein the thin film transistor includes a semiconductor layer and a gate electrode separated from the semiconductor layer, and
the storage capacitor includes a lower electrode and an upper electrode arranged over the lower electrode.

8. The display panel of claim 7, further comprising a first electrode layer and a second electrode layer arranged over the first electrode layer, wherein the first electrode layer is arranged on the thin film transistor,
wherein the first conductive line includes a same material as the gate electrode, and the second conductive line includes a same material as the second electrode layer.

9. The display panel of claim 8, wherein the third conductive line includes a same material as the upper electrode or the first electrode layer.

10. The display panel of claim 8, wherein the shield layer includes a same material as the upper electrode or the first electrode layer.

11. The display panel of claim 8, wherein each of the plurality of first lines further includes a fourth conductive line located in the display area.

12. The display panel of claim 11, wherein the fourth conductive line is connected to the first conductive line or the second conductive line through a contact hole.

13. The display panel of claim 12, wherein the fourth conductive line includes a same material as the first electrode layer.

14. The display panel of claim 7, wherein each of the plurality of second lines further includes a fifth conductive line located in the display area.

15. The display panel of claim 14, wherein the fifth conductive line is connected to the third conductive line through a contact hole.

16. The display panel of claim 15, wherein the fifth conductive line includes a same material as the gate electrode or the upper electrode.

17. A display apparatus comprising:
a substrate including an opening area, a non-display area at least partially surrounding the opening area, and a display area at least partially surrounding the non-display area;
a plurality of display elements arranged in the display area;
a plurality of first lines extending in a first direction, wherein each of the plurality of first lines includes a first bypass portion extending along an edge of the opening area, wherein each of the plurality of first lines includes a first conductive line or a second conductive line located in the non-display area, wherein each of the first conductive line and the second conductive line includes the first bypass portion, wherein the first conductive line and the second conductive line are alternately arranged on different layers from each other;

a plurality of second lines extending in a second direction intersecting with the first direction, wherein each of the plurality of second lines includes a second bypass portion extending along the edge of the opening area;

a shield layer arranged in the non-display area and overlapping at least one first bypass portion, wherein the shield layer is arranged between the first conductive line and the second conductive line in a vertical direction with respect to an upper suffice of the substrate, wherein the shield layer does not overlap the first conductive line; and a component including an electronic element arranged to correspond to the opening area.

18. The display apparatus of claim 17, wherein each of the plurality of second lines includes a third conductive line located in the non-display area, wherein each of the third conductive lines includes the second bypass portion, and wherein the third conductive lines at least partially overlap the first conductive line or the second conductive line.

19. The display apparatus of claim 18, wherein the third conductive line is arranged on a different layer than that of the shield layer.

\* \* \* \* \*